United States Patent [19]

Ii et al.

[11] Patent Number: 5,177,588
[45] Date of Patent: Jan. 5, 1993

[54] SEMICONDUCTOR DEVICE INCLUDING NITRIDE LAYER

[75] Inventors: Yoriko Ii; Masazumi Matsuura, both of Hyogo, Japan

[73] Assignee: Mitsubishi Denki Kabushiki Kaisha, Tokyo, Japan

[21] Appl. No.: 785,952

[22] Filed: Oct. 31, 1991

[30] Foreign Application Priority Data

Jun. 14, 1991 [JP] Japan .................... 3-143263

[51] Int. Cl.$^5$ .................... H01L 29/34; H01L 23/48
[52] U.S. Cl. .................... 257/640; 437/241; 437/228
[58] Field of Search .................... 357/54, 71; 437/241, 437/228

[56] References Cited

U.S. PATENT DOCUMENTS 4,349,609  9/1982  Takeda et al. .................... 437/203

FOREIGN PATENT DOCUMENTS 63-79327  4/1988  Japan .

OTHER PUBLICATIONS

"Reduction of Water in Inorganic SOG by Plasma Treatment", Ito et al., Extended Abstracts of the 22nd (1990 International) Conference on Solid State Devices and Materials, 1990, pp. 235-238.

*Primary Examiner*—Rolf Hille
*Assistant Examiner*—Robert Limanek
*Attorney, Agent, or Firm*—Lowe, Price, LeBlanc & Becker

[57] ABSTRACT

An improved semiconductor device having no posioned via produced therein includes a semiconductor substrate having a first conductor pattern formed thereon, a first insulator film provided on the semiconductor substrate to cover the first conductor pattern, and a coat applied onto the first insulator film to flatten an uneven surface of the first insulator film. A nitride layer having a thickness of 10Å or more and including a binding of silicon and nitrogen is provided in a surface of the coat. A second insulator film is formed on the coat including the nitride layer. A via hole for exposing a portion of the surface of the first conductor pattern is formed to penetrate the first insulator film, the coat and the second insulator film. The device further includes a second conductor pattern having a portion thereof buried in the via hole and thereby connected to the first conductor pattern.

5 Claims, 8 Drawing Sheets

SEMICONDUCTOR DEVICE INCLUDING NITRIDE LAYER

BACKGROUND OF THE INVENTION

1. Field of the Invention

The present invention relates generally to semiconductor devices and, more particularly, to an improved semiconductor device having no poisoned via produced therein. The invention further relates to a method of fabricating such a semiconductor device.

2. Description of the Background Art

FIGS. 12A and 12B are schematic cross-sectional views showing a representative dynamic random access memory (DRAM) device of interest in the present invention. FIG. 12A shows a part of a peripheral circuit of the DRAM, and FIG. 12B shows a part of a memory cell region. With reference to FIGS. 12A and 12B, an insulator region 22 for isolation is formed in a surface of a semiconductor substrate 21. An impurity diffusion region 23 such as a source/drain of a field effect transistor is formed at a portion surrounded by insulator region 22. Word lines 24 of polysilicon are provided on the surface of semiconductor substrate 21 with a gate insulator film 25 interposed therebetween. Word lines 24 are formed by low pressure CVD (Chemical Vapor Deposition) employing $SiH_4$. Word lines 24 are covered with a first interlayer insulation film 26 formed thereon and a sidewall insulation film 26a formed on sidewalls thereof. These insulation films (26, 26a) are formed by low pressure CVD using $SiH_4$ and $N_2O$ at a high temperature of 800° to 900° C.

A lower capacitor electrode 27 formed of polysilicon is connected to impurity diffusion region 23. Lower capacitor electrode 27 is covered with a capacitor dielectric film 28 which is covered with an upper capacitor electrode 29.

Upper capacitor electrode 29 is covered with a second interlayer insulation film 30. When capacitor electrodes (27, 29) of polysilicon are formed by low pressure CVD, a $PH_3$ gas may be added in order to dope phosphorus.

Bit lines 32 formed on second interlayer insulation film 30 are connected through a contact hole 31 to impurity diffusion region 23. Bit lines 32 are formed of an alloy of tungsten and silicon by low pressure CVD or sputtering. Bit lines 32 are covered with a third interlayer insulation film 33.

A first aluminum alloy interconnection 34 is formed on third interlayer insulation film 33 with a barrier metal 34a interposed therebetween. First aluminum alloy interconnection 34 is connected through a contact hole 38 to one of impurity diffusion regions 23. Barrier metal 34a is formed by sputtering TiN, TiW or the like. First aluminum alloy interconnection 34 is formed by sputtering an aluminum alloy containing silicon or copper. First aluminum alloy interconnection 34 is covered with a fourth interlayer insulation film 35.

A second aluminum alloy interconnection 36 is further formed on fourth interlayer insulation film 35 with a barrier metal 36a interposed therebetween. Second aluminum alloy interconnection 36 is connected through a contact hole 39 to first aluminum alloy interconnection 34. Second aluminum alloy interconnection 36 is covered with a passivation film 37 made of a silicon nitride. Passivation film 37 is formed by plasma employing $SiH_4$ and $NH_3$.

The present invention is directed to an improvement for preventing a poisoned via produced in formation of a via hole (the term with a broad concept including a contact hole and a through-hole) in an interlayer insulation film in a process of manufacturing the above-described DRAM device.

FIG. 13 is a cross-sectional view of a semiconductor device showing the state of production of a poisoned via, observed in the conventional step of forming an interlayer insulation film.

With reference to FIG. 13, a first silicon oxide film 3 is formed on a semiconductor substrate 1 to cover a first conductor pattern 2 by employing a plasma chemical vapor deposition. A solution of polysilanol having a chemical structural formula shown in FIG. 2 (which is dissolved in methanol, isopropyl alcohol or the like) is spin-coated onto first silicon oxide film 3. A resultant film is then subjected to a thermal treatment at 150°–450° C., to volatilize a solvent, thereby forming a coat 4. The spin-coating of the polysilanol solution onto first silicon oxide film 3 is made in order to planarize a surface of first silicon oxide film 3.

A hardening processing of coat 4 is carried out as follows. The semiconductor substrate is disposed in a vacuum chamber. An oxygen gas is applied to flow in the vacuum chamber at a flow rate of 4500 SCCM. A pressure in the vacuum chamber is set to 1.5 Torr. A high frequency wave of 13.65 MHz is applied to the electrode at output power of 800 W, thereby to generate oxygen plasma in the vacuum chamber. Semiconductor substrate 1 is exposed to this oxygen plasma for 10 minutes, so that coat 4 undergoes a plasma processing. The plasma processing advances hardening of coat 4, i.e., a three-dimensional implementation of the coat, as shown in FIG. 3. The resultant film is further subjected to a thermal treatment at a temperature of 450° C. for 15 minutes in a nitrogen atmosphere for a further hardening reaction.

Referring again to FIG. 13, a second plasma oxide film 6 is formed on coat 4. Thus, an interlayer insulation film 100 including first plasma oxide film 3, coat 4 and second plasma oxide film 6 is formed. A via hole 101 for exposing a portion of the surface of first conductor pattern 2 is formed in interlayer insulation film 100. A second conductor pattern 7 connected to first conductor pattern 2 is buried in via hole 101 by sputtering.

Since the conventional interlayer insulation film is formed by the foregoing method, a crosslinking reaction of polysilanol is not sufficiently advanced, and hence a large number of free hydroxyl groups remain within the coat, with reference to FIG. 3. Thus, there is such a disadvantage that coat 4 contains a high amount of moisture. If the moisture content of coat 4 is high, moisture absorbed in coat 4 is exerted into via hole 101 upon burying of second conductor pattern 7 into via hole 101 by sputtering after formation of via hole 101 in interlayer insulation film 100. Consequently, a sputtered metal no longer adheres precisely onto wall surfaces of via hole 101, resulting in production of a poisoned via.

SUMMARY OF THE INVENTION

One object of the present invention is to provide an improved semiconductor device having no poisoned via produced therein.

Another object of the present invention is to provide a semiconductor device including an interlayer insulation film having a flattened surface.

A further object of the present invention is to provide an improved method of manufacturing a semiconductor device having no poisoned via produced therein.

A still further object of the present invention is to provide a method of forming an interlayer insulation film including a coat having no hygroscopic property.

A still further object of the present invention is to reduce the number of processing steps in a method of manufacturing a semiconductor device.

A still further object of the present invention is to enhance yield in a method of manufacturing a semiconductor device.

To accomplish the above objects, a semiconductor device according to the present invention includes a semiconductor substrate having a first conductor pattern formed thereon, and a first insulator film formed on the semiconductor substrate to cover the first conductor pattern. A coat is applied onto the first insulator film to flatten an uneven or irregular surface of the first insulator film. A nitride layer of 10Å or more in thickness including a binding of silicon and nitrogen is provided in a surface of the coat. A second insulator film is formed on the coat including the nitride layer. A via hole for exposing a portion of the surface of the first conductor pattern is formed in and penetrates the first insulator film, the coat and the second insulator film. The semiconductor device includes a second conductor pattern having a portion thereof filled in the via hole and thereby connected to the first conductor pattern.

In a method of manufacturing a semiconductor device according to another aspect of the present invention, a semiconductor substrate having a first conductor pattern formed thereon is first provided. A first insulator film is then formed on the semiconductor substrate to cover the first conductor pattern. A coat for flattening unevenness or irregularities of a surface of the first insulator film is formed on the first insulator film. The substrate is heated up to a temperature of 200° C. or more, in which state a surface of the coat is exposed to nitrogen plasma. A second insulator film is formed on the coat. A via hole for exposing a portion of the surface of the first conductor pattern is formed in and penetrates the first insulator film, the coat and the second insulator film. A second conductor pattern connected through the via hole to the first conductor pattern is formed on the semiconductor substrate.

In a method of manufacturing a semiconductor device according to still another aspect of the present invention, a semiconductor substrate having a first conductor pattern formed thereon is first provided. A first insulator film is formed on the semiconductor substrate to cover the first conductor pattern. A coat for flattening unevenness or irregularities of a surface of the first insulator film is formed on the first insulator film. A second insulator film is formed on the coat. A via hole for exposing a portion of the surface of the first conductor pattern is formed in and penetrates the first insulator film, the coat and the second insulator film. With the semiconductor substrate heated up to a temperature of 200° C. or more, an end surface which is exposed by the via hole and defines an opening of the coat is subjected to plasma of nitrogen. A second conductor pattern connected through the via hole to the first conductor pattern is formed on the semiconductor substrate.

In accordance with the semiconductor device according to the present invention, since the nitride layer of 10Å or more in thickness including the binding of silicon and nitrogen is formed in the surface of the coat, the hygroscopicity of the coat decreases, so that the coat does not absorb moisture from the atmosphere. Therefore, no water is discharged from the coat upon burying the second conductor pattern in the via hole after forming the via hole in the coat. Consequently, a sputtered metal which is a material of the second conductor pattern precisely adheres to the wall surface of the via hole.

In accordance with a method of manufacturing a semiconductor device according to still another aspect of the present invention, with the semiconductor substrate heated to a temperature of 200° C. or more, the surface of the coat is subjected to nitrogen plasma.

Since the substrate is heated to a temperature of 200° C. or more, the hardening reaction of the coat is advanced sufficiently, thereby decreasing the moisture content of the coat. In addition, since the surface of the coat is subjected to nitrogen plasma, the nitride layer including the binding of silicon and nitrogen is formed on the surface of the coat. This nitride layer suppresses the hygroscopicity of the coat to thereby prevent the coat from absorbing moisture from the atmosphere.

In accordance with a method of manufacturing a semiconductor device according to still another aspect of the present invention, the semiconductor substrate is heated to a temperature of 200° C. or more, in which state the end surface exposed by the via hole and defining an opening of the coat is subjected to nitrogen plasma. Since the substrate is heated to a temperature of 200° C. or more, the hardening reaction of the coat advances sufficiently, thereby decreasing the moisture content of the coat. Further, since the end surface defining the opening of the coat is subjected to nitrogen plasma, the nitride layer including the binding of silicon and nitrogen is formed on the end surface of the coat. This nitride layer suppresses the hygroscopicity of the coat and prevents the coat from absorbing moisture from the atmosphere.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
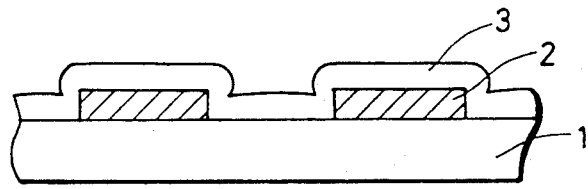
FIGS. 1A-1D are partially sectional views of a semiconductor device in the order of respective steps in a manufacturing method according to one embodiment of the present invention.

With reference to FIG. 1A, a first conductor pattern 2 is formed on a semiconductor substrate 1. A first plasma oxide film 3 is formed on semiconductor substrate 1 to cover first conductor pattern 2. First plasma oxide film 3 is formed by a plasma CVD method.

Figure 1B:
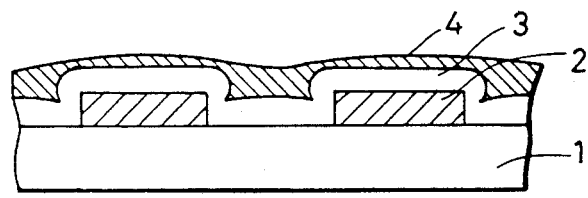
Figure 1C:
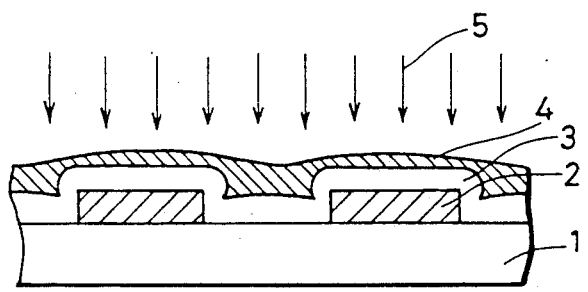
Figure 2:
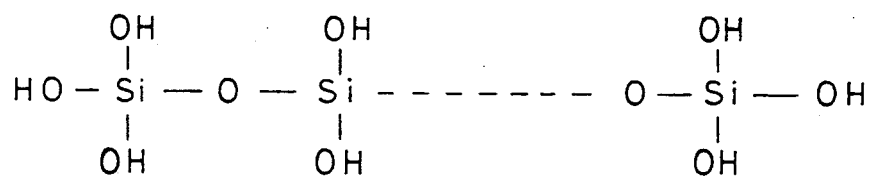
FIG. 2 is a chemical structural formula of polymer of silanol.

Referring to FIG. 1B, a solution of polysilanol (which is dissolved in methanol, isopropyl alcohol or the like) having a chemical structural formula shown in FIG. 2 or a solution of organosiloxane is spin-coated onto first plasma oxide film 3 so as to fill recesses on a surface of first plasma oxide film 3. The resultant film is then subjected to a thermal treatment at 80°–250° C. to volatilize a solvent, whereby a coat 4 is formed.

Figure 5:
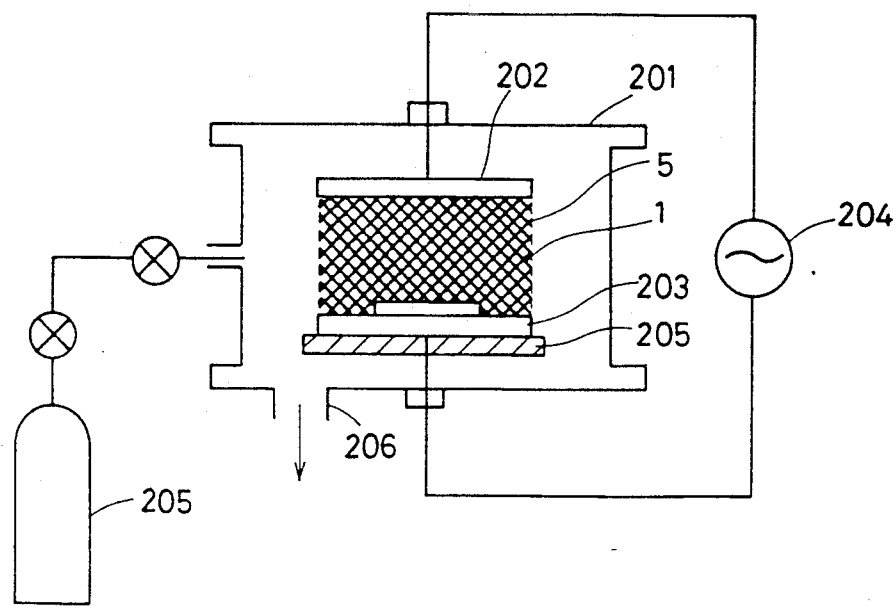
FIG. 5 is a conceptional diagram of a nitrogen plasma processing apparatus.

A hardening processing of coat 4 is carried out by using a plasma processing apparatus shown in FIG. 5. The plasma processing apparatus includes a vacuum chamber 201. A parallel planar upper electrode 202 and a parallel planar lower electrode 203 are disposed in vacuum chamber 201. A heater 205 is provided under lower electrode 203. A high-frequency power source 204 is connected to upper and lower electrodes 202 and 203. A nitrogen source 205 is connected to vacuum chamber 201. Vacuum chamber 201 has an exhaust port 206.

The hardening processing of the coat will now be described.

Semiconductor substrate 1 coated with coat 4 shown in FIG. 1B is mounted on lower electrode 203. Semiconductor substrate 1 is then heated to 300° C. by heater 205. A nitrogen gas is introduced at a flow rate of 1000 SCCM from nitrogen source 205 into vacuum chamber 201. A pressure in vacuum chamber 201 is adjusted to 0.3 Torr. A high frequency wave of 400 KHz is applied at output power of 400 W between upper and lower electrodes 202 and 203 by high-frequency power source 204. This causes generation of nitrogen plasma 5 in vacuum chamber 201. Semiconductor substrate 1 is placed in the atmosphere of nitrogen plasma 5 for 10 minutes.

Figure 4:
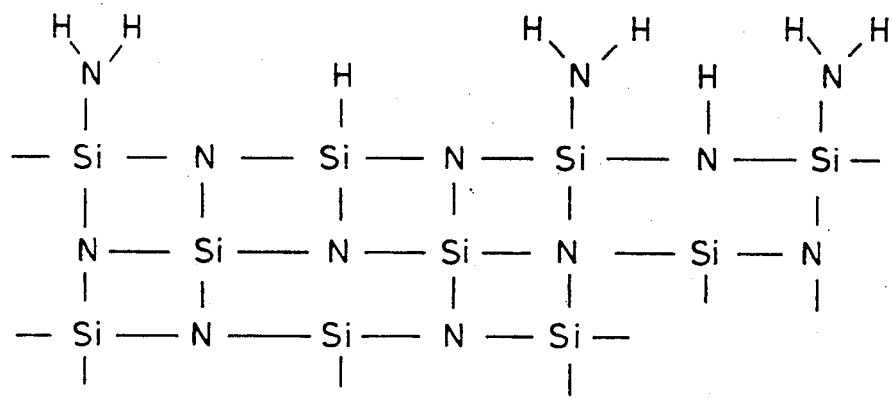
FIG. 4 is a chemical structural formula of the surface of a coat under a nitrogen plasma processing.

Under the foregoing plasma processing conditions, a nitride layer of 10Å or more in thickness which has a chemical structural formula shown in FIG. 4 and includes a binding of silicon and nitrogen is formed in the surface of coat 4.

Then, the resultant film undergoes a thermal treatment at a temperature of 450° C. in the nitrogen atmosphere for 15 minutes. This thermal treatment is made to further completely develop the implementation of network structure of the coat.

Figure 1D:
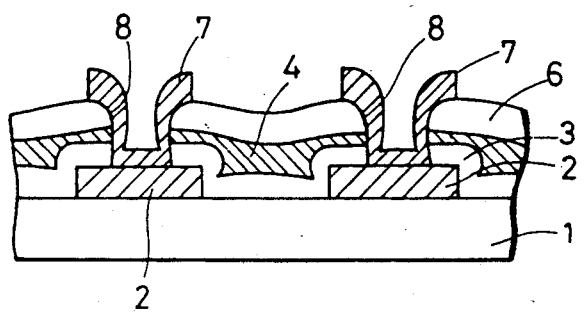

With reference to FIG. 1D, a second plasma oxide film 6 is formed on coat 4. A via hole 8 for exposing part of the surface of first conductor pattern 2 is formed to penetrate first plasma oxide film 3, coat 4 and second plasma oxide film 6.

A second conductor pattern 7 connected to first conductor pattern 2 is buried in via hole 8 by sputtering.

According to this embodiment, since the nitride layer of 10Å or more in thickness including the binding of silicon and nitrogen is formed in the surface of coat 4, the hygroscopicity of coat 4 decreases, and hence coat 4 absorbs no moisture from the atmosphere. Therefore, no water is exerted out of coat 4 upon burying the second conductor pattern in via hole 8 after forming via hole 8 in coat 4. Consequently, a sputtered metal being a material of second conductor pattern 7 adheres precisely to a wall surface of via hole 8. As a result, no poisoned via is produced.

Further, according to this embodiment, since the semiconductor substrate is heated to a temperature of 200° C. or more, a hardening reaction sufficiently advances within coat 4, resulting in a further decrease in moisture content of coat 4.

Figure 6:
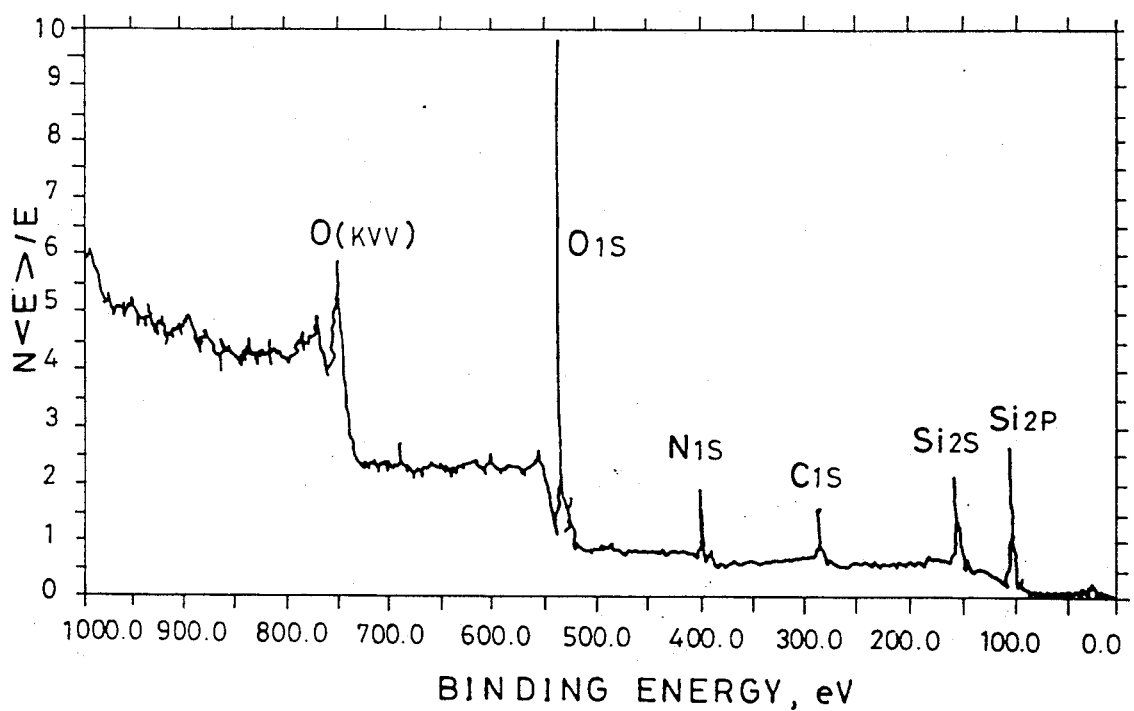
FIG. 6 is a spectrum diagram of X-ray photoemission spectroscopy analysis of the surface of the coat subjected to the nitrogen plasma processing.

FIG. 6 is a diagram showing the result of X-ray photoemission spectroscopy analysis of coat 4 processed by nitrogen plasma. As apparent from FIG. 6, it is revealed that a nitride layer having the binding of nitrogen and silicon is formed in the surface of the coat.

Figure 7:
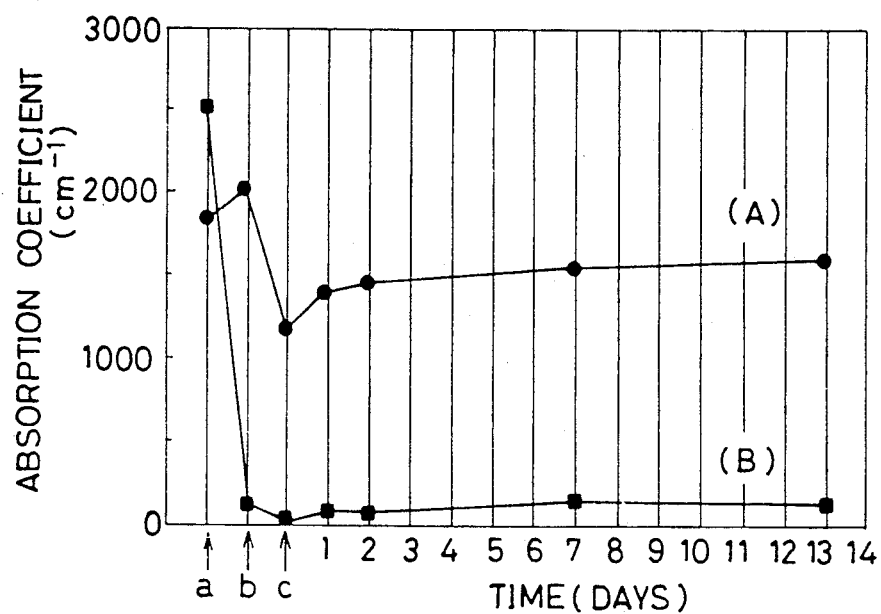
FIG. 7 is a diagram showing time-variations of water absorption coefficients of the coat.

FIG. 7 is a diagram plotting results of tracing time-elapsing variations in hygroscopicity of respective samples with respect to a case (A) where the coat undergoes an oxygen plasma processing and a case (B) where the coat undergoes an nitrogen plasma processing. In FIG. 7, the ordinate indicates absorption coefficients evaluated by measurement of an FT-IR spectrum. The absorption coefficients are calculated by a peak intensity of Si-OH around 3400 cm$^{-1}$. The abscissa indicates time (day). On the abscissa, a point (a) represents the time immediately after a solvent is volatilized; a point (b) represents the time immediately after a plasma processing; and a point (c) represents the time immediately after a thermal treatment at 450° C.

As apparent from FIG. 7, an absorption coefficient provided immediately after a thermal treatment of the coat subjected to the nitrogen plasma processing is lower by approximately 2000 cm$^{-1}$ than that of the coat subjected to the oxygen plasma processing. In addition, the nitrogen plasma-processed coat hardly absorbs water even with an elapse of several days.

Figure 8:
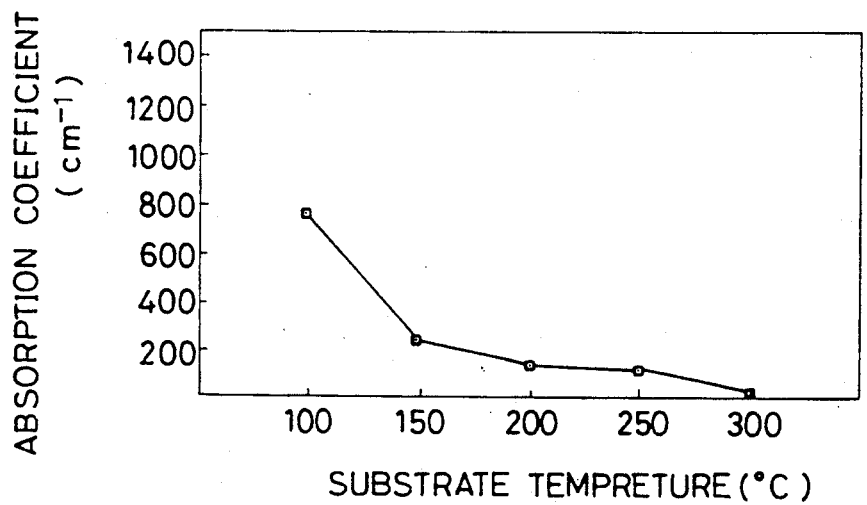
FIG. 8 is a diagram showing a temperature effect of a nitrogen plasma processing.

FIG. 8 is a diagram plotting results of the absorption coefficients provided immediately after a thermal treatment of the coat subjected to the nitrogen plasma processing at various temperatures. For the temperatures for the plasma processing, five different temperatures of 100° C., 150° C., 200° C., 250° C. and 300° C. are selected. Other conditions such as gas pressure, flow rate, frequency, output power and time are set to 0.3 Torr, 1000 SCCM, 400 KHz, 400 W and 10 minutes, respectively. As apparent from FIG. 8, if the nitrogen plasma processing is carried out at a temperature of 200° C. or more, then the absorption coefficient of the coat significantly decreases.

FIGS. 9A–9E are partially sectional views of a semiconductor device in the order of respective steps in a manufacturing method according to another embodiment of the present invention.

Figure 9A:
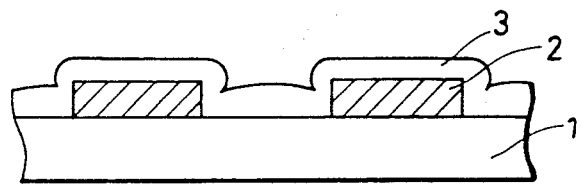
FIGS. 9A-9E are partially sectional views of a semiconductor device in the order of respective steps in a manufacturing method according to another embodiment of the present invention.

With reference to FIG. 9A, a first conductor pattern 2 is formed on a semiconductor substrate 1. A first plasma oxide film 3 is formed on semiconductor substrate 1 to cover first conductor pattern 2.

Figure 9B:
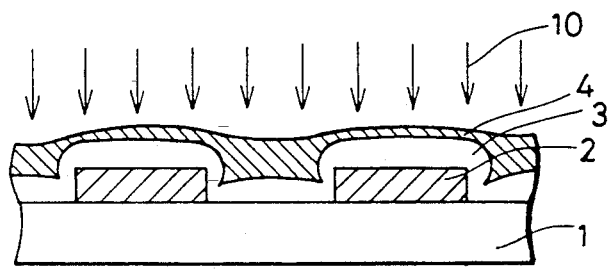

Referring to FIG. 9B, a polysilanol solution (dissolved in methanol, isopropyl alcohol or the like) having the chemical structural formula shown in FIG. 2 or an organosiloxane solution is spin-coated onto first plasma oxide film 3 to fill recesses in a surface of first plasma oxide film 3. Then, the resultant film is subjected to a thermal treatment at 150°–450° C. to volatilize a solvent, thereby forming a coat 4.

Figure 3:
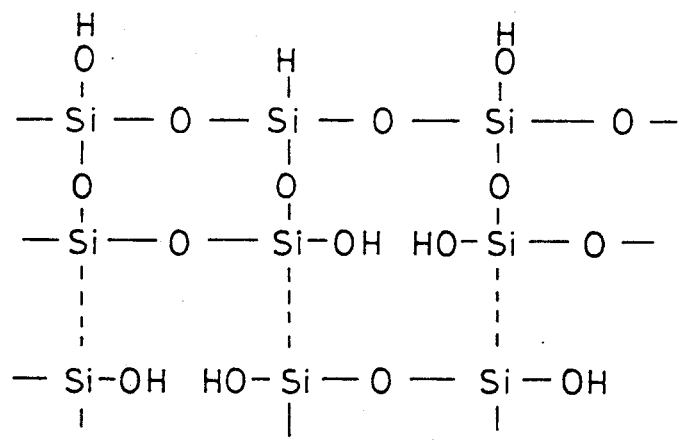
FIG. 3 is a chemical structural formula of a coat, the surface of which undergoes an oxygen plasma processing.

Referring to FIG. 9B, coat 4 is processed by a conventional hardening method, i.e., an oxygen plasma processing 10. The film is then subjected to a thermal treatment at a temperature of 450° C. for 15 minutes in nitrogen atmosphere. Such processings cause implementation of the network structure shown in FIG. 3 in coat 4.

Figure 9C:
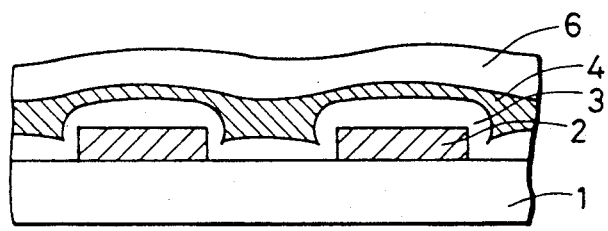

Referring to FIG. 9C, a second plasma oxide film 6 is formed on coat 4.

Figure 9D:
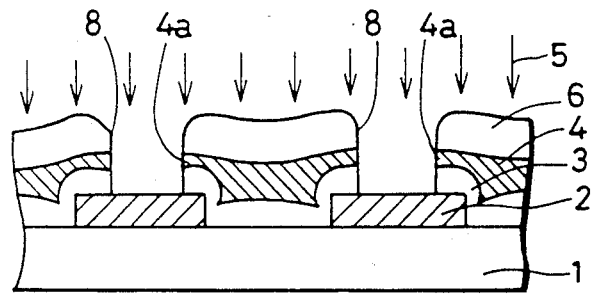

Referring to FIG. 9D, a via hole 8 for exposing part of the surface of first conductor pattern 2 is formed to penetrate first plasma oxide film 3, coat 4 and second plasma oxide film 6. The formation of via hole 8 causes an end surface 4a defining an opening of coat 4 to be exposed. With semiconductor substrate 1 heated to a temperature of 200° C. or more, end surface 4a which is exposed by via hole 8 and defines the opening of coat 4 is subjected to nitrogen plasma. The plasma processing causes a nitride layer of 10Å or more in thickness including a binding of silicon and nitrogen to be formed in end surface 4a of coat 4.

Figure 9E:
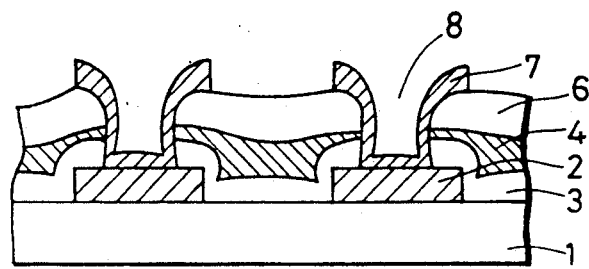

Referring to FIG. 9E, a second conductor pattern 7 connected through via hole 8 to first conductor pattern 2 is formed by sputtering. According to this embodiment, since the nitride layer is formed in end surface 4a defining the opening of coat 4, a hygroscopic action of coat 4 is suppressed by the formed nitride layer. Therefore, coat 4 does not discharge water into the via hole upon formation of second conductor pattern 7 by sputtering. Consequently, a sputtered metal being a material of second conductor pattern 7 precisely adheres onto a wall surface of via hole 8. No poisoned via is thus produced.

While the case where coat 4 undergoes oxygen plasma processing 10 is exemplified in FIG. 9B, the present invention is not limited to this, and the oxygen plasma processing may be replaced by a nitrogen plasma processing as a matter of course. Accordingly, the hygroscopicity of coat 4 can be suppressed with still higher efficiency.

For the following reason, application of the present invention provides such an effect that the number of process steps can be reduced. That is, in the embodiment shown in FIG. 1, coat 4 is first subjected to the nitrogen plasma processing and then to the thermal treatment at a temperature of 450° C. for 15 minutes in the nitrogen atmosphere, and after that, the second plasma oxide film is formed. As apparently seen from the curve (B) in FIG. 7, however, dehydration has already sufficiently advanced and the nitride layer is formed on the surface of the coat at the time (b) immediately after the nitrogen plasma processing. Therefore, a thermal treatment step provided after the plasma processing, i.e., the step of thermally treating the film at a temperature of 450° C. for 15 minutes in the nitrogen atmosphere becomes unnecessary. Elimination of the thermal treatment step results in such an effect that the number of process steps is reduced.

Figure 10:
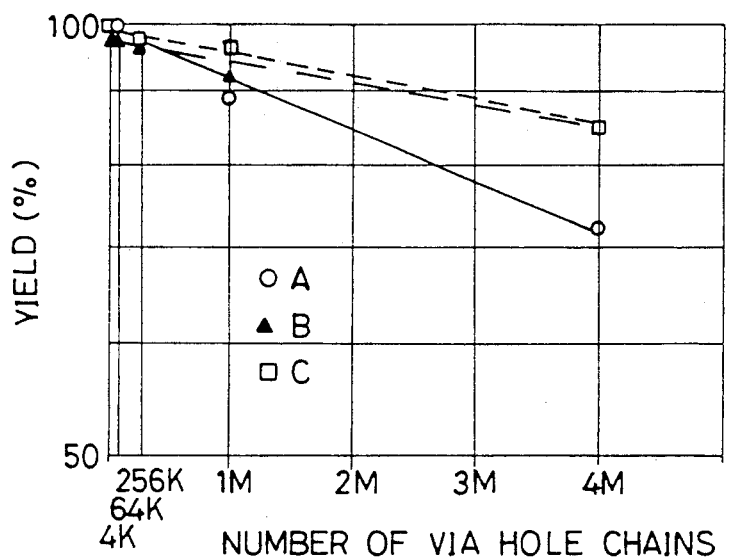
FIG. 10 is a diagram showing the relationship between the number of via hole chains and yields.
Figure 11:
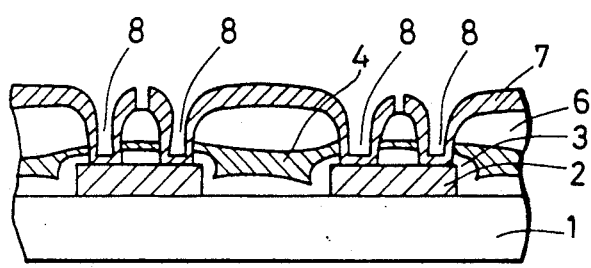
FIG. 11 is a partially sectional view of a semiconductor device for use in explaining a concept of via hole chains.
Figure 12A:
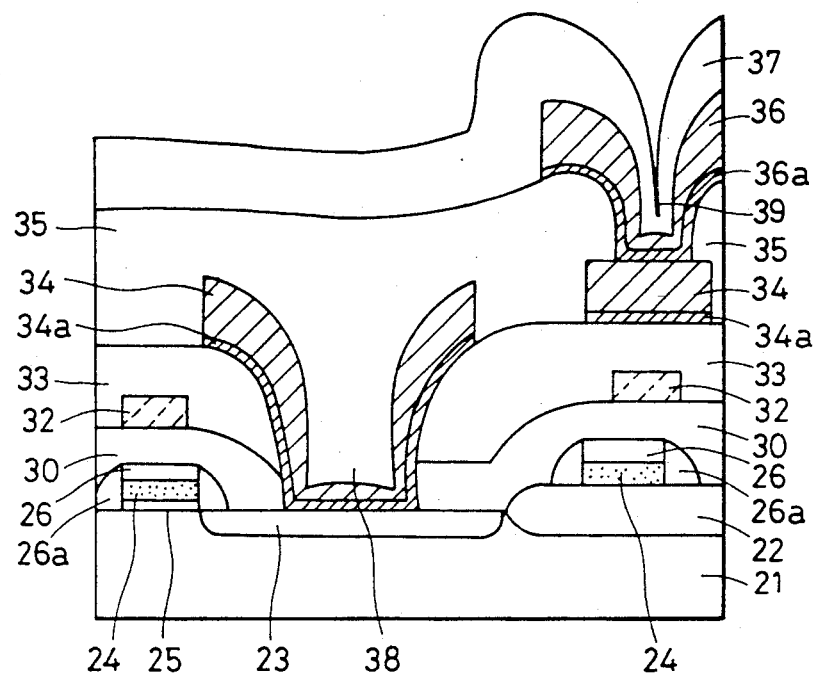
FIGS. 12A and 12B are cross-sectional views of a semiconductor device having an interlayer insulation film, to which the present invention is applied.
Figure 12B:
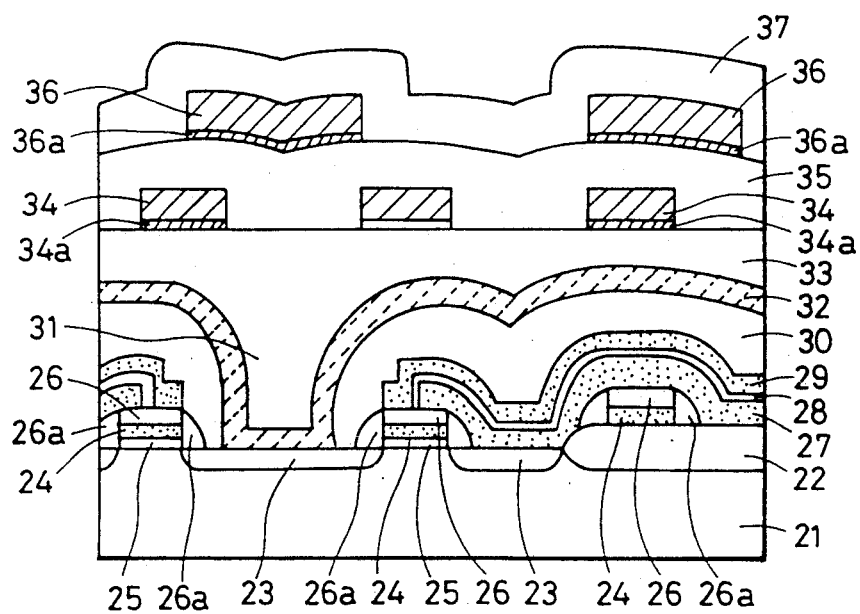
Figure 13:
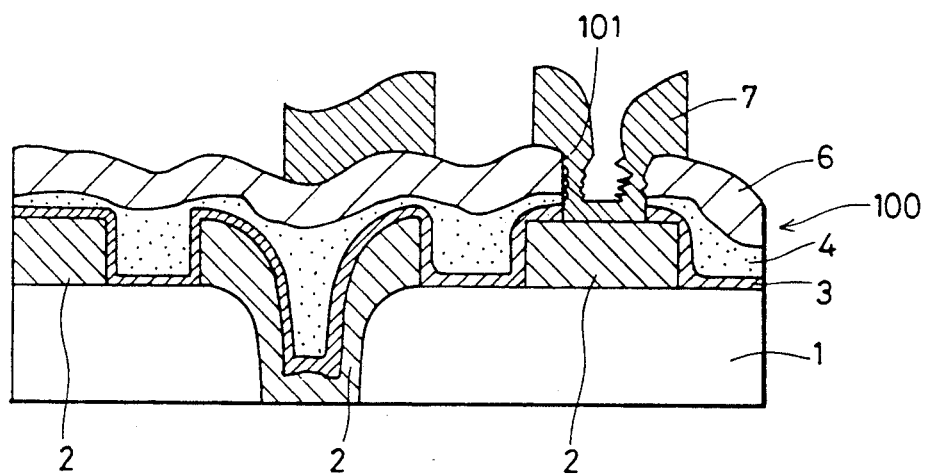
FIG. 13 is a view showing a disadvantage caused in a conventional method of forming an interlayer insulation film.

FIG. 10 is a diagram showing the relationship between the number of via hole chains and yield. In FIG. 10, a curve (A) represents the case where a conventional method (only the oxygen plasma processing) is applied to a process of forming an interlayer insulation film; a curve (B) represents the case where the nitrogen plasma processing of the present invention is applied; and a curve (C) represents the case where second plasma oxide film 6 is formed immediately after the application of the nitrogen plasma processing, with reference to FIGS. 1C and 1D. A via hole chain is constituted by a series of via holes 8 of 0.8 μm in diameter as shown in FIG. 11. As can be seen from FIG. 10, it is apparent that a higher yield is achieved in either the case where the nitrogen plasma of the present invention is employed in the hardening processing of the coat (curve B) or the case where a plasma oxide film is successively formed on the coat already subjected to the nitrogen plasma processing (curve C) as compared with the case where only the oxygen plasma is employed in the hardening processing of the coat (curve A).

In the semiconductor device according to the present invention, since the nitride layer of 10Å or more in thickness including the binding of silicon and nitrogen is formed in the surface of the coat, the hygroscopicity of the coat decreases, and hence the coat absorbs no moisture from the atmosphere. Therefore, no water is exerted out of the coat upon burying the first conductor pattern into the via hole after formation of the via hole in the coat. Consequently, the sputtered metal being a material of the second conductor pattern precisely adheres onto the wall surface of the via hole. This results in such an effect that any poisoned via is not produced.

In accordance with a manufacturing method of a semiconductor device according to another aspect of the present invention, the semiconductor substrate is heated to a temperature of 200° C. or more, in which state the surface of the coat is subjected to nitrogen plasma. Because of the heating of the semiconductor substrate to 200° C. or more, the hardening reaction of the coat sufficiently advances, thereby decreasing the moisture content of the coat. Further, since the surface of the coat is subjected to the nitrogen plasma, the nitride layer including the binding of silicon and nitrogen is formed on the surface of the coat. The nitride layer suppresses the hygroscopicity of the coat and thus prevents the coat from absorbing water from the atmosphere. Consequently, the sputtered metal being a material of the second conductor pattern precisely adheres onto the wall surface of the via hole. This leads to the effect that no poisoned via is produced.

In a manufacture method of a semiconductor device according to still another aspect of the present invention, since the end surface which is exposed by the via hole and defines the opening of the coat is subjected to nitrogen plasma with the semiconductor substrate heated to a temperature of 200° C. or more, the nitride layer including the binding of silicon and nitrogen is formed on the end surface. The nitride layer suppresses the hygroscopicity of the coat and thus prevents the coat from absorbing water from the atmosphere. Therefore, water is not discharged from the coat when the second conductor pattern is buried in the via hole. Consequently, the sputtered metal which is a material of the second conductor pattern precisely adheres onto the wall surface of the via hole. Thus, a poisoned via is no longer produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a first conductor pattern formed thereon;
   a first insulator film provided on said semiconductor substrate and covering said first conductor pattern;
   a coat applied onto said first insulator film to flatten an uneven surface of said first insulator film, said coat being formed of a hygroscoic material;
   a nitride layer having a thickness of 10Å or more provided in a surface of said coat and including a binding of silicon and nitrogen;
   a second insulator film provided on said coat including said nitride layer.
   a via hole exposing a portion of a surface of said first conductor pattern through said first insulator film, said coat and said second insulator film; and
   a second conductor pattern having a portion thereof buried in said via hole and thereby connected to said first conductor pattern.

2. The semiconductor device according to claim 1, wherein
   a nitride layer having a thickness of 10Å or more and including a binding of silicon and nitrogen is formed at an end surface exposed by said via hole and defining an opening of said coat.

3. The semiconductor device according to claim 1, wherein
   said first and second insulator films each comprise a silicon oxide film.

4. A semiconductor device, comprising:
   a semiconductor substrate having a first conductor pattern formed thereon;
   a first insulator film provided on said semiconductor substrate and covering said first conductor pattern;
   a coat applied onto said first insulator film to flatten an uneven surface of said first insulator film, said coat comprising an organopolysiloxane polymer;
   a nitride layer having a thickness of 10Å or more provided in a surface of said coat and including a binding of silicon and nitrogen;
   a second insulator film provided on said coat including said nitride layer;
   a via hole exposing a portion of a surface of said first conductor pattern through said first insulator film, said coat and said second insulator film; and
   a second conductor pattern having a portion thereof buried in said via hole and thereby connected to said first conductor pattern.

5. A semiconductor device, comprising:
   a semiconductor substrate having a first conductor pattern formed thereon;
   a first insulator film provided on said semiconductor substrate and covering said first conductor pattern;
   a coat applied onto said first insulator film to flatten an uneven surface of said first insulator film, said coat comprising polysilanol;
   a nitride layer having a thickness of 10Å or more provided in a surface of said coat and including a binding of silicon and nitrogen;
   a second insulator film provided on said coat including said nitride layer;
   a via hole exposing a portion of surface of said first conductor pattern through said first insulator film, said coat and said second insulator film; and
   a second conductor pattern having a portion thereof buried in said via hole and thereby connected to said first conductor pattern.

* * * * *